(12) United States Patent
Viswanathan et al.

(10) Patent No.: US 8,803,302 B2
(45) Date of Patent: Aug. 12, 2014

(54) SYSTEM, METHOD AND APPARATUS FOR LEADLESS SURFACE MOUNTED SEMICONDUCTOR PACKAGE

(75) Inventors: Lakshminarayan Viswanathan, Phoenix, AZ (US); Lakshmi N. Ramanathan, Sammamish, WA (US); Audel A. Sanchez, Tempe, AZ (US); Fernando A. Santos, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/484,664

(22) Filed: May 31, 2012

(65) Prior Publication Data
US 2013/0320515 A1    Dec. 5, 2013

(51) Int. Cl.
*H01L 21/00*    (2006.01)

(52) U.S. Cl.
USPC ........... 257/676; 438/106; 438/112; 438/113; 438/122; 438/125; 438/127; 438/460; 438/464

(58) Field of Classification Search
USPC ......... 438/106, 112, 113, 122, 125, 127, 460, 438/464
See application file for complete search history.

(56) References Cited

U.S. PATENT DOCUMENTS

| | | | | |
|---|---|---|---|---|
| 5,200,362 A | * | 4/1993 | Lin et al. | 29/841 |
| 5,773,879 A | * | 6/1998 | Fusayasu et al. | 257/678 |
| 6,083,811 A | * | 7/2000 | Riding et al. | 438/460 |
| 6,247,229 B1 | * | 6/2001 | Glenn | 29/841 |
| 6,309,909 B1 | * | 10/2001 | Ohgiyama | 438/112 |
| 6,465,883 B2 | | 10/2002 | Olofsson | |
| 6,534,849 B1 | * | 3/2003 | Gang | 257/678 |
| 6,867,367 B2 | | 3/2005 | Zimmerman | |
| 6,917,097 B2 | | 7/2005 | Chow et al. | |
| 7,053,299 B2 | | 5/2006 | Zimmerman | |
| 7,351,611 B2 | | 4/2008 | Yee et al. | |
| 7,411,289 B1 | * | 8/2008 | McLellan et al. | 257/700 |
| 7,445,967 B2 | | 11/2008 | Abdo et al. | |
| 7,821,116 B2 | | 10/2010 | Madrid | |
| 7,868,471 B2 | | 1/2011 | Camacho et al. | |
| 7,989,951 B2 | | 8/2011 | Yeung et al. | |
| 8,089,159 B1 | * | 1/2012 | Park et al. | 257/773 |
| 8,115,305 B2 | * | 2/2012 | Camacho et al. | 257/734 |
| 8,227,921 B1 | * | 7/2012 | Park et al. | 257/773 |

(Continued)

OTHER PUBLICATIONS

U.S. Appl. No. 13/326,636, filed Dec. 15, 2011, entitled "Packaged Leadless Semiconductor Device".

(Continued)

*Primary Examiner* — Zandra Smith
*Assistant Examiner* — Sophia Nguyen

(57) ABSTRACT

A packaged semiconductor device may include a termination surface having terminations configured as leadless interconnects to be surface mounted to a printed circuit board. A first flange has a first surface and a second surface. The first surface provides a first one of the terminations, and the second surface is opposite to the first surface. A second flange also has a first surface and a second surface, with the first surface providing a second one of the terminations, and the second surface is opposite to the first surface. A die is mounted to the second surface of the first flange with a material having a melting point in excess of 240° C. An electrical interconnect extends between the die and the second surface of the second flange opposite the termination surface, such that the electrical interconnect, first flange and second flange are substantially housed within a body.

19 Claims, 6 Drawing Sheets

(56) References Cited

U.S. PATENT DOCUMENTS

| | | |
|---|---|---|
| 2003/0102537 A1* | 6/2003 | McLellan et al. ............. 257/666 |
| 2004/0011699 A1* | 1/2004 | Park ............................. 206/710 |
| 2007/0178626 A1* | 8/2007 | Ismail et al. .................. 438/108 |
| 2007/0278701 A1* | 12/2007 | Chang et al. .................. 257/787 |
| 2008/0272475 A1 | 11/2008 | Dijkstra et al. |
| 2008/0308951 A1* | 12/2008 | Li et al. ......................... 257/778 |
| 2009/0079050 A1 | 3/2009 | Steenbruggen et al. |
| 2010/0144101 A1* | 6/2010 | Chow et al. ................... 438/127 |
| 2011/0059579 A1* | 3/2011 | Eu et al. ........................ 438/122 |
| 2012/0175784 A1* | 7/2012 | Lin et al. ....................... 257/774 |
| 2012/0248626 A1* | 10/2012 | Lee et al. ...................... 257/774 |

OTHER PUBLICATIONS

*Ex parte Quayle* Action mailed Jun. 26, 2013 for U.S. Appl. No. 13/326,636, 8 pages.

Notice of Allowance mailed Jul. 29, 2013 for U.S. Appl. No. 13/326,636, 12 pages.

\* cited by examiner

# SYSTEM, METHOD AND APPARATUS FOR LEADLESS SURFACE MOUNTED SEMICONDUCTOR PACKAGE

BACKGROUND OF THE INVENTION

1. Field of the Disclosure

The present invention relates in general to electronic devices, and, in particular, to leadless surface mount semiconductor packages.

2. Description of the Related Art

Semiconductor die are encapsulated in a semiconductor package for protection from damage by external stresses and to provide a system for carrying electrical signals to and from the chips. Many different types of semiconductor packages exist, including dual-in-line packages, pin grid array packages, tape-automated bonding (TAB) packages, multi-chip modules (MCMs), and power packages. One type of power package is a high power package used for a high power semiconductor device that is capable of dissipating greater than ten watts of power.

A need exists for a package for a high power semiconductor device that has improved thermal conductivity for improved reliability, that is less expensive than ceramic-based packages, and that can be used to package multiple semiconductor die in a single package.

BRIEF DESCRIPTION OF THE DRAWINGS

So that the manner in which the features and advantages of the embodiments are attained and can be understood in more detail, a more particular description may be had by reference to the embodiments thereof that are illustrated in the appended drawings. However, the drawings illustrate only some embodiments and therefore are not to be considered limiting in scope as there may be other equally effective embodiments.

The use of the same reference symbols in different drawings indicates similar or identical items.

DETAILED DESCRIPTION

Typically, power packages use relatively high resistivity die attach materials that have a high lead content, a large thickness, and a low thermal conductivity of approximately twenty to thirty watts per meter Kelvin (w/m-K). Each of these characteristics contribute to heat transfer problems during device operation. These power packages also typically have an air cavity enclosed by ceramic components, which are expensive. Furthermore, these power packages are typically limited to a single semiconductor die per package, which requires: (1) matching components to be located on the same chip as the high power semiconductor device and results in lossy devices with poor electrical performance; or (2) matching components to be located on one or more different chips in different packages and requires a larger footprint or a larger amount of space in the final product for multiple packages.

Specific embodiments described herein entail a leadless packaged device that includes one or more components, such as a semiconductor die, mounted in a package that is suitable for high power applications without the use of a lead frame. The leadless packaged device includes a relatively thick heat sink flange, but some embodiments have no separate lead frame structure, which is typically included to connect the input and output of a device to a circuit board. The components to be packaged can be attached to the heat sink flange using a high temperature die attach process. The flange/component combination can then be housed, such as in an encapsulant (e.g., a plastic material) so that the lower surface of the heat sink flange and the terminal pads remain exposed from the encapsulant to form leadless terminations, e.g., interconnects. As used herein, the term 'housing' can refer to either a solid overmolded structure or an air housing or cavity without encapsulant material.

Such a technique facilitates packaging flexibility and achieves improvements in wire bond quality. Furthermore, flatness of the packaged semiconductor device and co-planarity of the elements is maintained due to the placement of the relatively thick heat sink flanges, or die attached thereto, onto a thermal tape attached to a carrier substrate. Accordingly, a lower profile package with enhanced performance and improved reliability can be achieved for high power radiofrequency applications.

Figure 1:
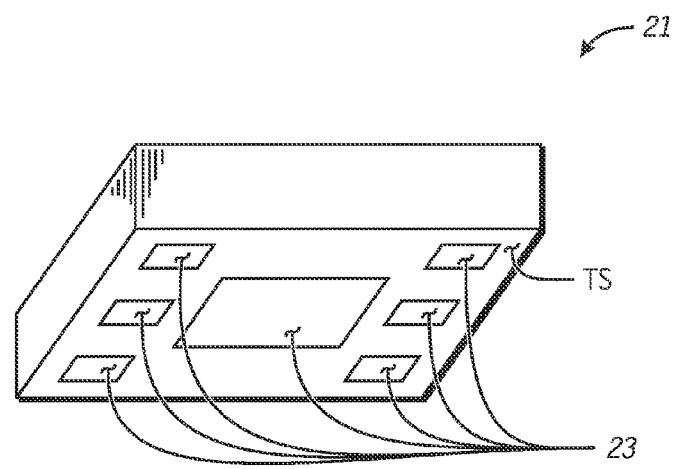
FIG. 1 is a schematic diagram of an embodiment of a packaged semiconductor device (SD)

Referring to FIG. 1, a packaged semiconductor device (SD) 21, such as a radio frequency (RF) device, comprises a major surface referred to as a termination surface, labeled TS, that comprises a plurality of terminations 23 configured as leadless interconnects to be surface mount attached to a PCB. The PCB is not shown.

Figure 2:
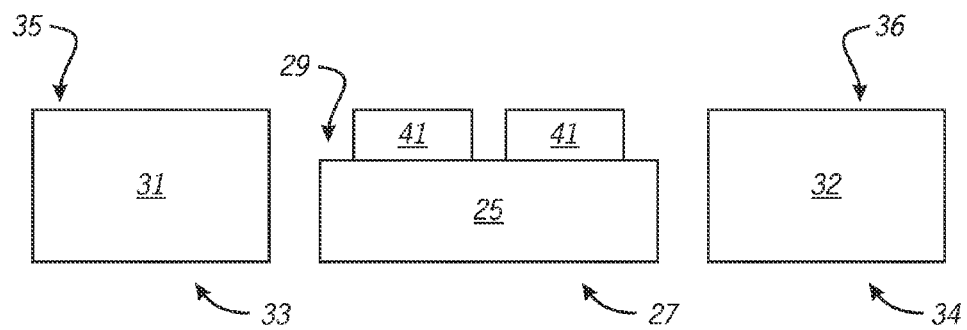
FIG. 2 is schematic side view of an embodiment of a partially packaged SD.

FIG. 2 illustrates a portion of package SD 21, which includes a first flange 25 (or heat sink flange), a second flange 31, and a third flange 32, each of which correspond to the termination surface TS of FIG. 1. The first flange 25 has a first surface 27 and a second surface 29. The first surface 27 includes the larger of the terminations 23 illustrated at FIG. 1. The second surface 29 is opposite the surface 27 and can be substantially parallel to the first surface 27. The second flange 31 has a first surface 33 and a second surface 35. The first surface 33 corresponds to a second one of the plurality of smaller terminations 23 of FIG. 1. The second surface 35 is opposite the second surface 33 and can be substantially parallel to the first surface 33. The third flange 32 has a first surface 34 and a second surface 36. The first surface 34 corresponds to a second one of the plurality of smaller terminations 23 of FIG. 1. The second surface 36 is opposite the second surface 33 and can be substantially parallel to the first surface 33. The flanges 25, 31, 32 are electrically and thermally conductive, and each flange 25, 31, 32 may have a thickness of about 30 mils to about 100 mils. In other embodiments the thickness is about 40 mils to about 100 mils. In still other embodiments, the thickness is about 40 mils to about 65 mils.

Embodiments of the heat sink flanges, e.g., flange 25, illustrated herein may be thermally and electrically conductive copper or a copper laminate material. Individual heat sink flanges are shown for simplicity of illustration. In some embodiments, the heat sink flange may be a single flange, or in an array of interconnected heat sink flanges (not shown), as known to those skilled in the art. The heat sink flange is sized to accommodate one or more semiconductor dies in accordance with the particular design of the semiconductor device.

Locations of the flanges may be selectively plated to provide a portion of the surface of the heat sink flange suitable for a subsequent die attach operation.

One or more semiconductor dies may be coupled to the heat sink flange 25. In an embodiment, the semiconductor dies may be high power, e.g., greater than 30 watts. Radiofrequency semiconductor dies may be attached to a surface of the heat sink flange using a high temperature bonding process, such as a gold-silicon eutectic bonding die attach process. In such an embodiment, the flange thickness of the heat sink flange may be of suitable thickness, for example, at least 30 mils, in order to withstand the high temperatures (e.g., greater than 400° C.) needed for gold-silicon eutectic bonding without damage.

Unfortunately, a high temperature bonding process may not be suitable for some leadless surface mount packages because of multiple dies, the metallurgical nature of the die attach, and the thermal expansion mismatch between the semiconductor material and Cu can cause warping of the Cu and, thus, the terminations or otherwise damage the semiconductor device.

One or more dies is mounted to the second surface 29 of the first flange 25. The dies 41 may comprise active or passive components. For example, an active component can include such a semiconductor die that includes transistors, such as a die having microprocessor, a die having memory, and the like. An active component may be a high power (e.g., greater than 30 watts) radio frequency die. A passive component can include a capacitor, inductor, resistor, and the like. Die other than those illustrated can be mounted to other flanges.

A material, such as a Pb-free metallic system that forms a metallurgical joint, having a melting point in excess of 240° C. may be used for this purpose. Other embodiments may have a melting point in excess of 260° C. For example, the following materials can be used to attach the one or more dies 41 to the second surface: AuSi, AuSn, or Ag. The approximate melting points of these materials are: AuSi, ~360° C.; AuSn, ~280° C.; and Ag, ~800° C. The silver may comprise sintered silver. Each die 41 may have the same or different thickness, which can be about 3 mils to about 5 mils, or about 1 mil to about 10 mils in other embodiments. For AuSi, the bond may be formed by Si in the die mixing with Au on the back of the die and Au on the flange. For AuSn, the bond may form from the plated AuSn on the back of the die or a combination of Au and Sn plated on the back of the die, or plated selectively on the flange below where the die goes. The Ag bond may be formed by nano-Ag or micro-Ag attach material that is included in the interface. According to an embodiment, radiofrequency semiconductor dies may be attached to a surface of the heat sink flange using a high temperature bonding process, such as a gold-silicon eutectic bonding die attach process. In such an embodiment, the flange thickness of the heat sink flange may be of suitable thickness, for example, at least 30 mils, in order to withstand the high temperatures (e.g., greater than 400° C.) needed for gold-silicon eutectic bonding without damage. Thus, for high power applications, it is desirable to surface mount the one or more semiconductor dies of a semiconductor device using a robust, highly reliable die attach process, for example, a high temperature metallurgical bonding process such as gold-silicon bonding, gold-tin bonding, silver bonding, and so forth. In contrast, lead-free metallurgical die attach materials provide package 100 with a more environmentally-friendly characteristic and the use of a die attach comprising, for example, AuSi, AuSn, or Ag (with no epoxy). In addition, a Cu or other non-ceramic flange provides package 100 with its better thermal conductivity and lowered thermal resistivity, which produces improved reliability characteristics. This is in contrast to typical power packages that use relatively high resistivity die attach materials that have a high lead content, a large thickness, and a low thermal conductivity of approximately 20 to 30 W/m-K. Each of these characteristics contributes to heat transfer problems during device operation.

Figure 3A:
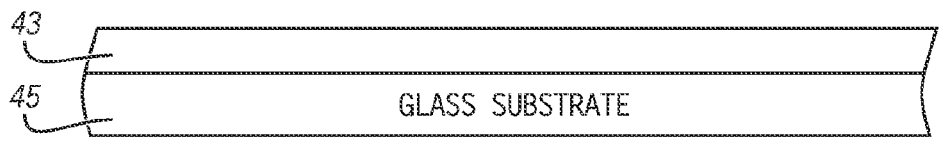
FIGS. 3A-3G depict an embodiment of a sequence of processes for fabricating a packaged SD.
Figure 3B:
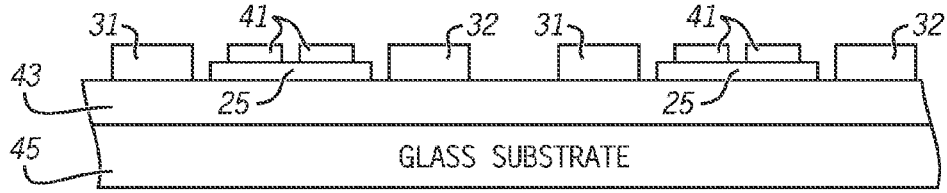

FIGS. 3A through 3G illustrate a particular embodiment of forming the SD 21. At FIG. 3A, a double-sided thermal tape 43 (FIG. 3A) may be affixed to a carrier substrate 45 (e.g., a glass substrate) that acts to hold various components during the packaging process that forms a plurality of packaged devices at the same time. The flanges 25, 31, 32 may be picked by automated packaging equipment and placed onto the tape 43 (FIG. 3B). As shown in FIG. 3B, two packages are being contemporaneously formed, each package including a set of corresponding flanges 25, 31, 32. The die 41 and first flange 25 of each package be can be formed having a combined thickness T that is substantially equal to the thickness T of the second flange 31, or different. Because of thermal considerations, die 41 may be attached to flange 25 prior to flange 25 being placed on tape 43.

Figure 3C:
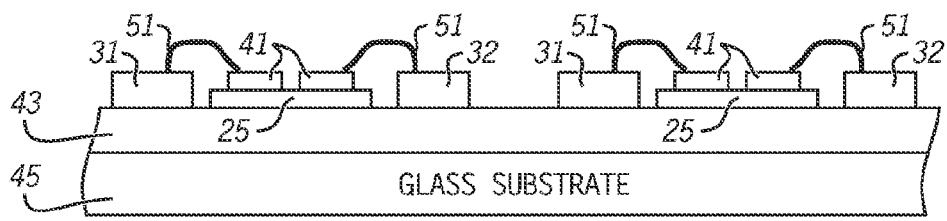

As shown in FIG. 3C, one or more electrical interconnects 51 may be formed between the dies 41 and the second surfaces 35, 36 (FIG. 2) of the second flanges 31, 32, respectively. The electrical interconnects 51 may comprise bond wires or other types of interconnects, as will be discussed in greater detail below. Bond wires and wire bonding processes are known by those skilled in the art. In an embodiment, 2 mil gold wires may be utilized, and in another embodiment, 10 mil aluminum wires may be used. However, various known wires of varying materials and diameters may be utilized in accordance with particular design requirements.

Figure 3D:
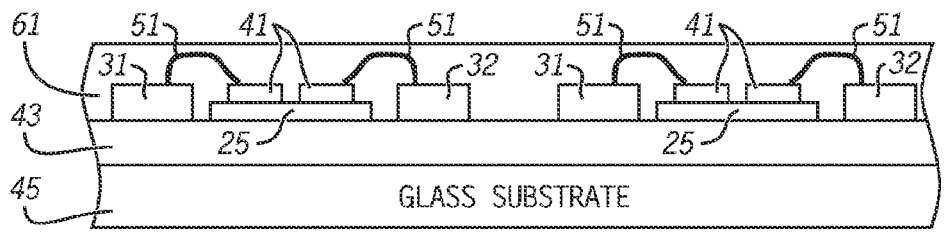
Figure 3E:
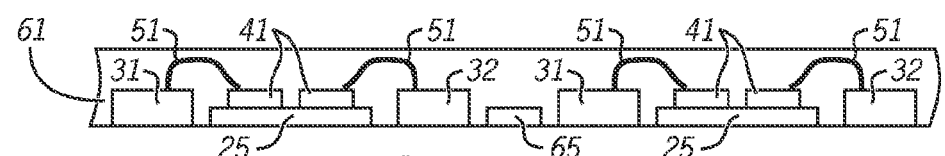

In FIG. 3D, a body 61 is formed using an encapsulating material that (when cured) forms a solid that substantially encapsulates the flanges 25, 31, 32, dies 41 and electrical interconnects 51. The body 61 has been formed to provide support thereto, such that the electrical interconnects 51 and flanges 25, 31, 32 are substantially encapsulated e.g., housed, within body 61 to form a packaged device. In these embodiments, the flanges 25, 31, 32 each have a surface that is co-planar to a surface of each other flange by virtue of being attached to the carrier substrate by the thermal tape 43. These coplanar surfaces are not covered by the encapsulating material. After encapsulating, the carrier substrate 45 and the thermal tape 43 are removed as indicated at FIG. 3E to expose the coplanar surfaces of the flanges 25, 31, 32.

Figure 3F:
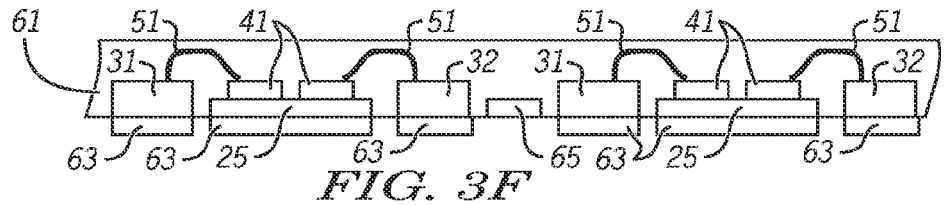

At each of the flanges 25, 31, 32, respectively, a metalized surface 63 can be formed, as indicated at FIG. 3F, overlying the exposed coplanar surfaces of the flanges 25, 31, 32. For example, the metalized surfaces 63 may comprise Sn or NiPdAu, which is typically deposited using a plating process. The metalized surfaces 63 form the outermost terminations 23 of the package device. The terminations 23 may be co-planar along the termination surface TS to less than about 0.001 inches.

Figure 3G:
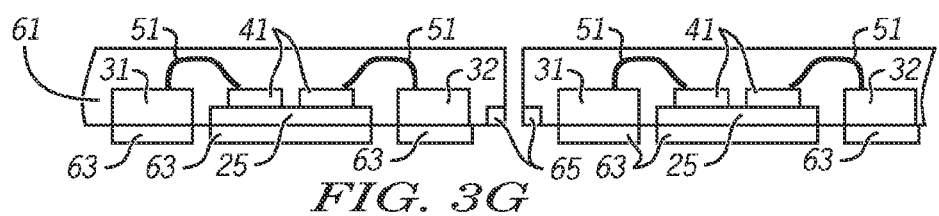

The packaged devices being contemporaneously formed are singulated to form individual packages, as indicated at FIG. 3G. Singulation can be performed using mechanical sawing, laser ablation, and the like.

A metallic film 65 (FIG. 3E) may be encapsulated that resides between the packaged SDs 21. The metallic film 65 may comprise Cu and may have a thickness of about 5 mils. The metallic film may be located at the bottom of the flange (e.g., stuck to the adhesive), coplanar with the bottoms of the terminations. The metallic film 65 may be exposed on at least one of the four sidewalls of each of the packaged SDs 21 when the packaged SDs are singulated (compare FIGS. 3F and 3G).

This process is well suited for overmold or encapsulation bodies, rather than the air cavity bodies described below. Note that this feature is not a leadframe that provides an electrically and thermally conductive chassis or frame, and in other embodiments, need not be used.

In some embodiments, the packaged SD may have a power capacity or power rating of about 30 W to about 400 W. In addition, the packaged SD may be configured to operate at radio frequencies of about 3 kHz to about 100 GHz. Typical sizes of the flanges may comprise 200×200 mils, 400×400 mils, 240×650 mils, 260×650 mils, 800×400 mils, or 1200× 500 mils. Power also depends on die technology, voltage used, etc.

Figure 4A:
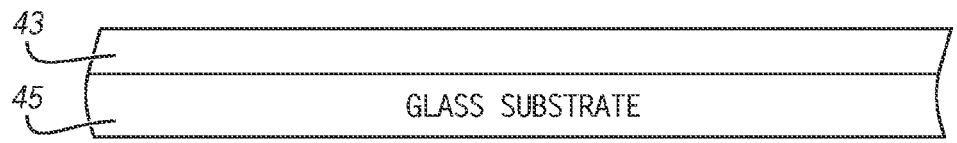
FIGS. 4A-4F depict another embodiment of a sequence of processes for fabricating a packaged SD.
Figure 4B:
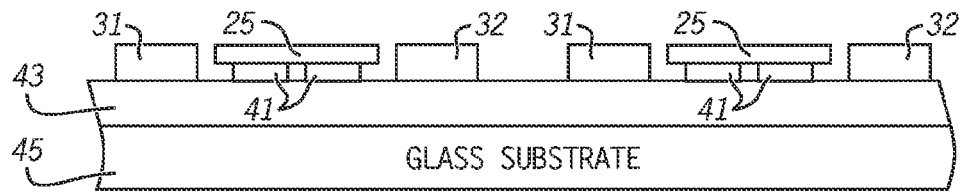

Another embodiment of forming SD 21 is depicted in FIGS. 4A through 4F. FIG. 4A is similar to FIG. 3A and therefore, the same reference numerals are maintained to represent the carrier substrate 45 and thermal tape 43. Furthermore, in the present embodiment, the combined height of the die 41 and flange 25 can be selected to have substantially the same height as flanges 31, 32 to facilitate a subsequent planarization process, as described below. Flanges 31, 32 are attached to the thermal tape 43 as illustrated at FIG. 4B. In addition, the combinations of flange 25/die 41 are attached to the thermal tape 43 with the active side of die 41 in contact with the thermal tape 43.

Figure 4C:
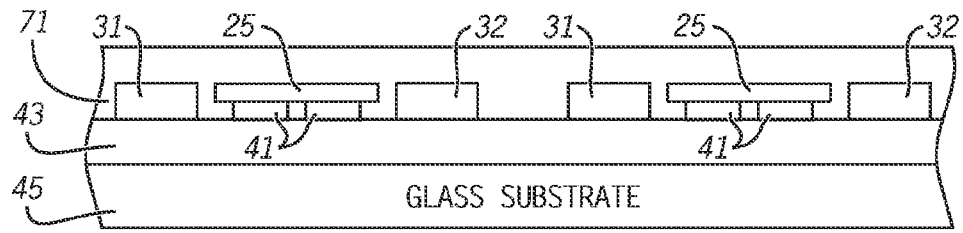
Figure 4D:
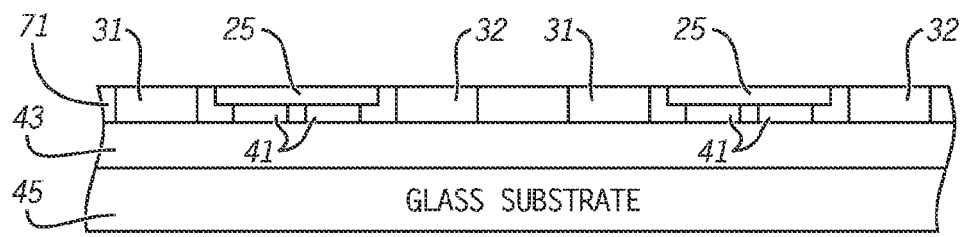

At FIG. 4C, encapsulating material 71, which can be the same or similar type encapsulating material as the encapsulating material 61 previously described, is deposited to form a package body that substantially encapsulates the components placed on the thermal tape. A portion of the encapsulating material 71 is removed using a planarization process to expose the backsides of the flanges 25, 31, 32. The planarization process can include a mechanical process, chemical process, the like, and combinations thereof. The exposed backsides of the flanges 25, 31, 32 implement or facilitate formation of the termination surface TS (FIG. 1), e.g., they can form surface mount contacts.

Subsequently, the backsides of the flanges 25, 31, 32 can be metalized with a material 73 (FIG. 4E) to form surface mount contacts at a final termination surface TS (FIG. 1) to be electrically connected to a substrate, such as a PCB (not illustrated). The thermal tape 43 and carrier 45 are removed, as illustrated at FIG. 4F, thus leaving a plurality of individual package workpieces, e.g., packages that have not been completed. The flanges 31, 32 of the plurality of completed workpieces have not yet been electrically connected to the die 41. Various processing flows can be implemented subsequent to removal of the carrier 45 and thermal tape 43 to complete processing of packaged devices SD 21.

Figure 4E:
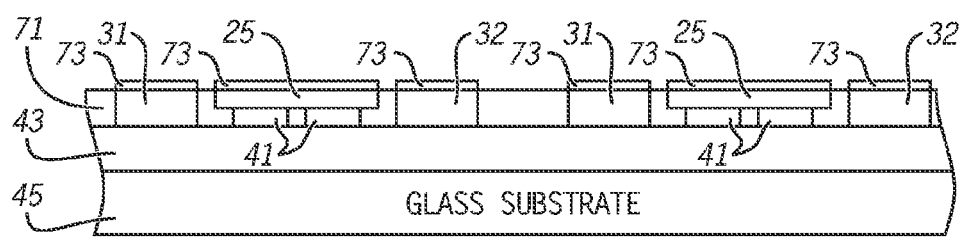
Figure 4F:
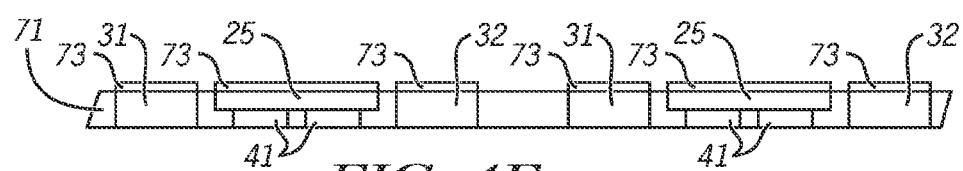
Figure 5A:
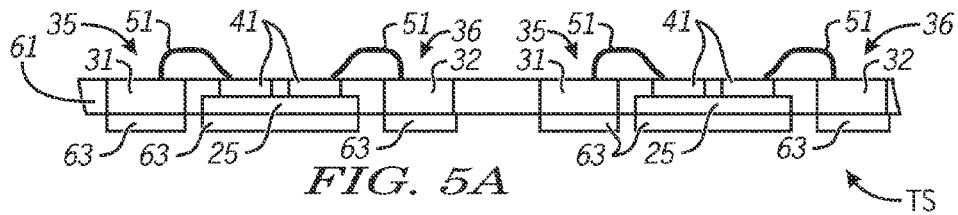
FIGS. 5A-5C and 6A-6C depict alternate embodiments of processes for completing fabrication of a packaged SD.

As a further example, the carrier substrate 45 and thermal tape 4 are illustrated as being removed subsequent to formation of the backside metal at FIG. 4E. It will be appreciated however that the carrier substrate 45 and thermal tape 43 could be removed subsequent to prior steps. For example, the carrier substrate 45 and thermal tape 43 could be removed any time subsequent to formation of the body of the package as illustrated at FIG. 4C. FIG. 5 illustrates a particular embodiment where encapsulation of each package workpiece of a panel occurs prior to singulation of the individual package workpieces. For example, each package workpiece of the panel has electrical interconnects formed between its die 41 and flanges 31, 32, as illustrated at FIG. 5A. In particular, electrical interconnects 51 have been formed between the package workpiece die 41 and the surfaces 35 of the flanges 31 opposite the termination surface TS, and between die 41 and the surface 36 of the flanges 32. The electrical interconnects 51 may comprise a wire bond as illustrated at FIG. 5A, or other types of interconnects as described in greater detail herein.

Figure 5B:
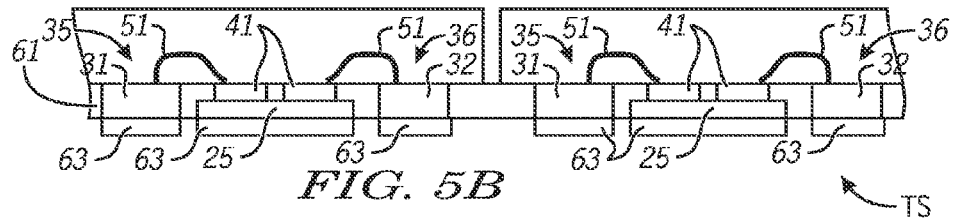
Figure 5C:
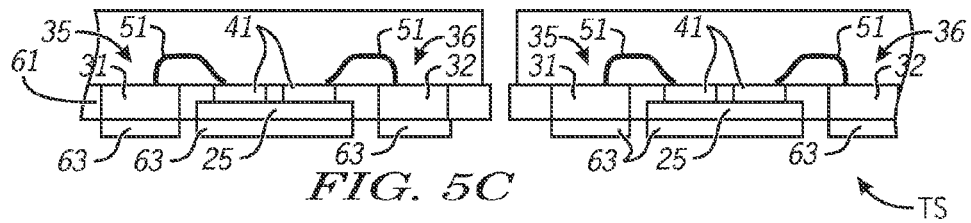

As illustrated at FIG. 5B, a housing is formed over each of the individual package workpieces to encapsulate the flanges 25, 31, 32 and electrical interconnect 51 of each package workpiece. The housing can be formed by depositing an encapsulation material, as previously described, or by providing an air housing, e.g. a cover which maintains an air space, overlying the components of each package workpiece. According to a particular embodiment, the particular encapsulation is chosen to support a power capacity of about 30 W to about 400 W. Subsequent to encapsulating the individual package substrates, the panel can be singulated (FIG. 5C) to form individual package devices.

Figure 6A:
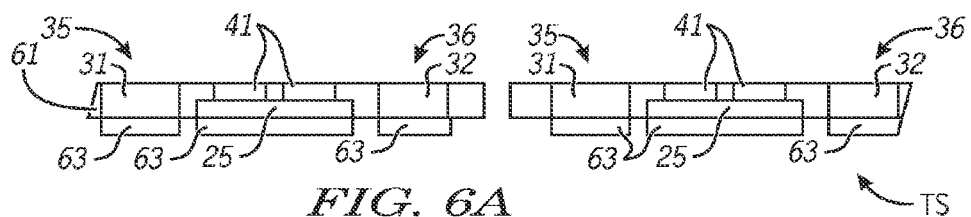
Figure 6B:
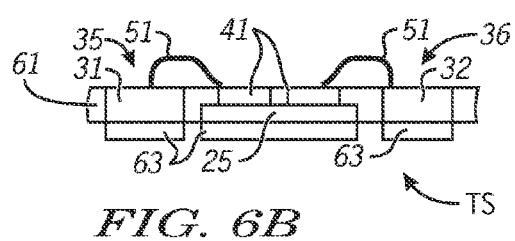
Figure 6C:
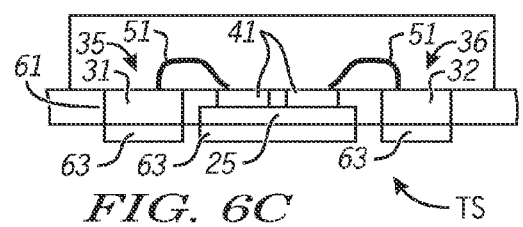

FIG. 6 illustrates an alternate embodiment, from that of FIG. 5, for implementing package devices. In particular, as illustrated at FIG. 6A, the panel is singulated prior to encapsulation to form individual package workpieces, one of which is illustrated in FIGS. 6B and 6C. For each singulated package workpiece, as illustrated at FIG. 6B, electrical interconnects 51 are formed between its die 41 and its flange surfaces 35 and 36, which are opposite the termination surface TS. As illustrated at FIG. 6C, the housing is formed over the singulated package workpiece to encapsulate its components. The housing can be formed by depositing encapsulation material, as previously described, or provided by an air housing. The air housing may comprise mounting a lid to the assembly to house the electrical interconnect in an air cavity, such that the electrical interconnect is free of encapsulation material. As discussed previously, the housing is chosen to support power dissipation capacity of between about 30 Watts to about 400 W, and to support high frequency RF applications.

Figure 7:
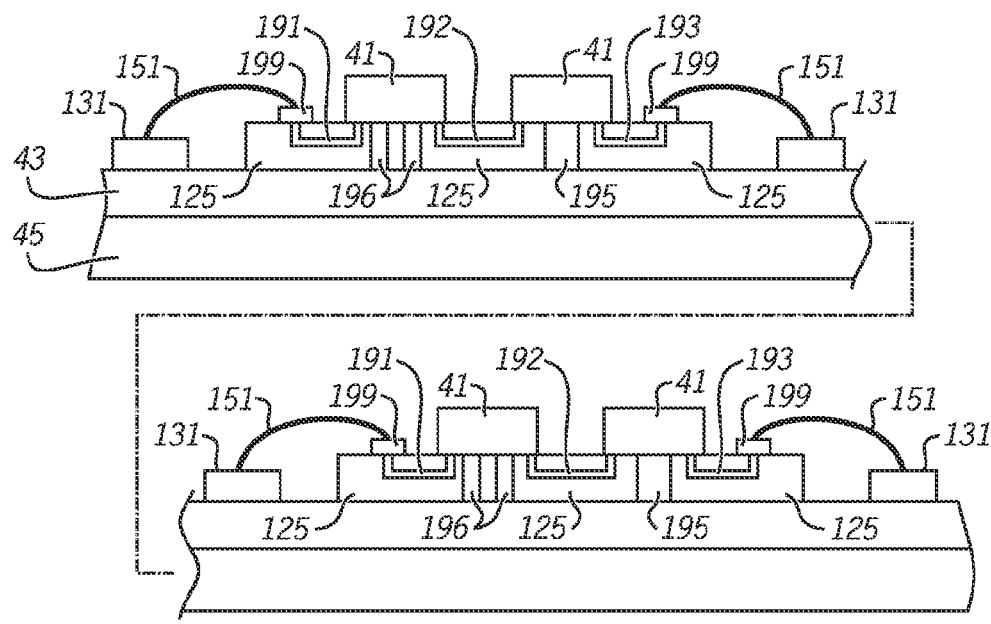
FIGS. 7-10 are schematic side views of other embodiments of packaged SDs.

It will be appreciated, that many alternate embodiments of the described packaging process exist. For example, instead of a composite structure that includes die 41 attached to a conductive flange 25, other compound structures may be formed. For example, FIG. 7 illustrates a compound structure that is formed prior to being attached to the thermal tape that includes die 41 attached to a printed circuit board 125 (PCB 125). The PCB 125 is illustrated to include conductive studs 195 (heat sinks), and interconnects including inter-level interconnects 191-193 and through vias 196. The conductive studs 195 can be formed from a material that provides greater thermal conductivity than the substrate of the PCB 125. For example, the conductive studs 195 can include copper, aluminum, other metals, the like, and combinations thereof.

Figure 8:
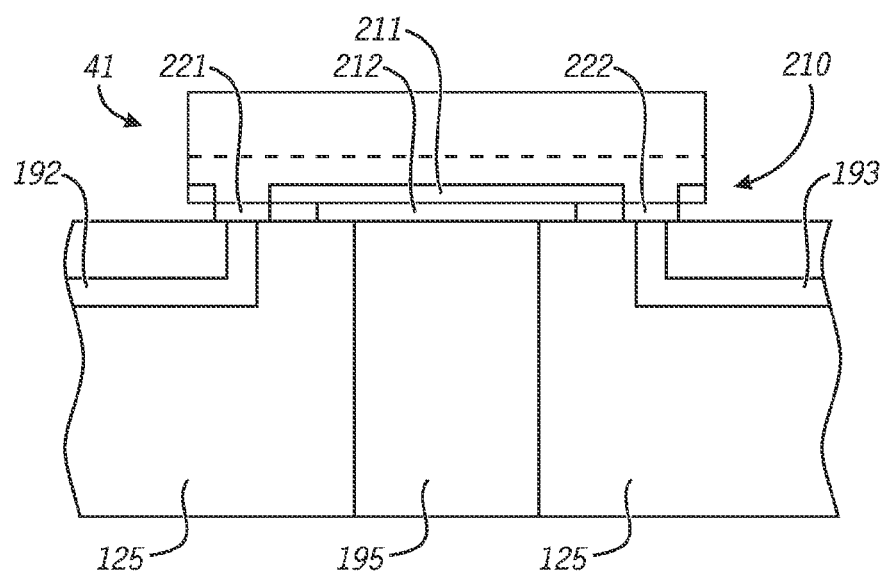

A particular embodiment of the compound structure that includes the die 41 and the PCB 125 is illustrated in greater detail at FIG. 8, which illustrates the die 41 mounted with its active surface 210 mounted facedown such that die bond pads 221 and 222 have been surface mount attached to the PCB 125. Interlevel routing 192 and 193 is illustrated as being in electrical contact with the die bond pads 221, 222, respectively. As illustrated in FIG. 8, interlevel routing 192 electrically connects the die bond pad 221 to a die bond pad of the adjacent die 41 that is attached to the same PCB board 125. Interlevel interconnect 193 connects the die bond pad 222 to a PCB bond pad 199 of the printed circuit board 125 as also illustrated at FIG. 7. The conductive stud 195, which in effect is a sufficiently large heat sink to dissipate heat from die 41, is in contact with a heat conductive interface 212 (FIG. 8), such as a metallic pad, and extends through the PCB board 125 to an opposing surface that is opposite the surface where the die 41 is mounted. The large heat conductive interface 212 overlies a dielectric region 211 that electrically isolates the heat conductive interface 212 from any underlying conductive features at the active region 210 of the die 41.

Figure 9:
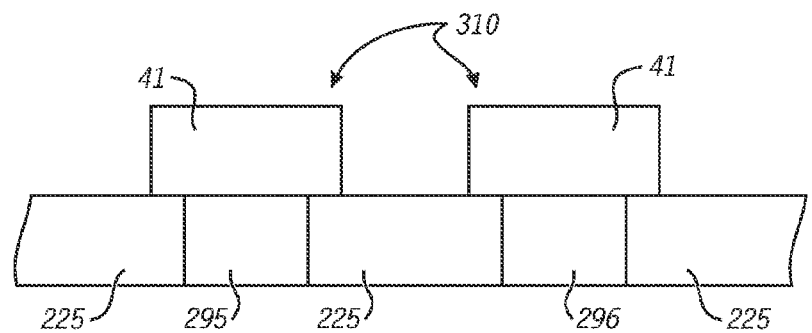

FIG. 9 illustrates an alternate embodiment of a compound structure that includes the dies 41 and a PCB 225. In particular, the dies 41 are mounted on conductive studs 295, 296, respectively, which themselves are formed through the PCB 225 to provide heat sink functionality. The resulting composite structure can be picked and placed with the die 41 face-down against the thermal tape, or with the die 41 mounted face-up, wherein the conductive studs 195 are in contact with the thermal tape. Though not specifically illustrated, it will be appreciated that additional conductive routing can be implemented using interlevel interconnects formed within the PCB 225. In particular, bond pads can be formed near the periphery of PCB 225 that can be wire bonded directly to bond pads of die 41 using conventional wire bonding, while other bond pads can be formed near the periphery of PCB 225 that can be wire bonded directly to flanges, similar to flanges 31, 32 previously described.

Figure 10:
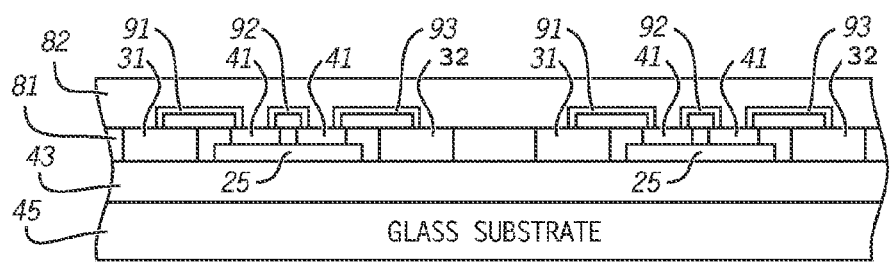

FIG. 10 illustrates an alternate embodiment of providing conductive interconnects between the die 41 and flanges 31, 32. In particular, instead of forming conventional wire bonds, additional layers are formed overlying the top side of the package device, e.g., the side opposite the thermal tape, after formation of the body portion 81. For example, the body portion 81 comprises a dielectric material that is planarized to expose the top surfaces of the die 41 and flanges 31, 32. Subsequently, additional conductive and dielectric layers are formed to implement conductive interconnects 91, 92, 93 between terminals, e.g., bond pads, of die 41 and flanges 31, 32. Formation of inter-level interconnects eliminates the need for conventional wire bonding techniques. The housing 82 can be formed by depositing an encapsulation material, as previously described, or by providing an air housing, e.g. a cover which maintains an air space, overlying the components of each package workpiece.

In some embodiments, a packaged semiconductor device (SD) comprises a termination surface comprising a plurality of terminations configured as leadless interconnects to be surface mounted to a circuit board. A first flange may have a first surface and a second surface, the first surface providing a first one of the plurality of terminations, and the second surface is opposite to the first surface. A second flange may have a first surface and a second surface, the first surface providing a second one of the plurality of terminations, and the second surface is opposite to the first surface. A die may be mounted to the second surface of the first flange with a Pb-free, die attach material having a melting point in excess of 240° C. In addition, an electrical interconnect may extend between the die and the second surface of the second flange opposite the termination surface, such that the electrical interconnect, first flange and second flange are substantially housed within a body.

The packaged SD may be configured to operate at radio frequencies of greater than about 3 kHz to about 100 GHz (e.g., 80 GHz). In other embodiments, it operates at about 3 kHz to about 10 GHz. The electrical interconnect may comprise a wire bond, and the die may have a thickness of about 3 mils to about 5 mils. The electrical interconnect also may comprise at least one interconnect level comprising a conductive layer and a dielectric layer (e.g., a printed circuit board or PCB). The body may comprise a solid body that substantially encapsulates the flanges, die and electrical interconnect to provide support thereto. The die and second flange may have surfaces furthest from the termination surface that are co-planar. The body also may comprise a lid mounted to the packaged SD to house the electrical interconnect in an air cavity, such that the electrical interconnect is free of encapsulation material.

The flanges may be electrically and thermally conductive and each flange may have a thickness of about 30 mils to about 100 mils. A surface of each of the flanges may further comprise an additional conductive layer of material opposite the die at the termination surface, the additional conductive layers form the terminations, and the terminations are co-planar along the termination surface to less than about 0.001 inches. A panel may comprise a plurality of packaged SDs, including the packaged SD described. The panel may further comprise a metallic film encapsulated between the packaged SDs, such that a metallic portion is exposed on at least one sidewall of each of the packaged SDs when the packaged SDs are singulated. The metallic film may comprise Cu and have a thickness of about 5 mils.

All of the terminations of the packaged SD may be on the termination surface, and the packaged SD may have no side wall terminations. The termination surface may comprise a first surface area, and the terminations comprise a second surface area that is in a range of about 0.2% to about 20% of the first surface area. The die may comprise a first die of an active component or a passive component, and may further comprise a second die mounted to the second surface of the second flange. The die and first flange may comprise a combined thickness that is substantially equal to a thickness of the second flange. The packaged SD may have a power capacity of greater than about 30 W to about 400 W. Alternatively, at least one of the first and second flanges may be embedded in a circuit board.

Some embodiments of a method of packaging a semiconductor device (SD) may comprise (a) placing a first component comprising a die mounted to a first flange on an adhesive substrate; (b) placing a second flange on the adhesive substrate adjacent to but spaced apart from the first component; (c) electrically interconnecting the die and the second flange; (d) housing at least portions of the flanges by encapsulation to form an assembly surrounding the flanges; and (e) housing the flanges and electrical interconnect such that the packaged SD has a power capacity of greater than about 30 W.

The die may be mounted to the first flange with a material having a melting point in excess of 260° C. In some embodiments, (a) comprises placing the first component with the die in contact with the adhesive substrate, such that a surface of the die that is furthest from the adhesive substrate and a surface of a second flange are co-planar. In other embodiments, after (d), the method may further comprise thinning the encapsulant to expose backsides of the flanges adjacent a termination surface. Step (c) may comprise forming a wire bond. Steps (d) and (e) may comprise substantially encapsulating the flanges, die and electrical interconnect in a solid material but not one surface of the flanges. Step (e) may comprise mounting a lid to the assembly to house the electrical interconnect in an air cavity, such that the electrical interconnect is free of encapsulation material.

In other embodiments, the die has a thickness of about 3 mils to about 5 mils; the flanges are electrically and thermally conductive and each flange has a thickness of about 30 mils to about 100 mils; and the packaged SD is configured to operate at radio frequencies of about 3 kHz to about 100 GHz.

A surface of each of the flanges may further comprise an additional conductive layer of material opposite the die at a termination surface, and the additional conductive layers of material comprise Sn or NiPdAu and form terminations that are co-planar along the termination surface to less than about 0.001 inches.

A method of forming a panel may comprise a plurality of packaged semiconductor devices, including the packaged semiconductor device, and (e) occurs before the packaged semiconductor device is singulated from the panel. The method may further comprise placing a metallic film between the packaged SDs before (d), encapsulating the metallic film in (e), and then cutting the panel at the metallic film such that a metallic portion is formed on side walls of each of the packaged SDs when the panel is cut, and the metallic film comprises Cu and has a thickness of about 5 mils. In addition, the terminations of the packaged SD may be at a termination surface, and the packaged SD may have no side wall terminations. The termination surface may comprise a first surface area, and the terminations comprise a second surface area that is in a range of about 0.2% to about 20% of the first surface area. The method may further comprise embedding at least one of the first and second flanges in a printed circuit board.

In still other embodiments, a method of packaging a semiconductor device (SD) may comprise (a) mounting a die to a first flange to form a first component; (b) placing the die on the adhesive substrate with the first flange extending therefrom; (c) placing a second flange on the adhesive substrate adjacent to but spaced apart from the first component, such that the die and second flange have surfaces that are co-planar; (d) housing at least portions of the die and flanges by encapsulation to form an assembly; (e) electrically interconnecting the die and the second flange; (f) adding an additional conductive layer of material to surfaces of the flanges opposite the die to form a termination surface with terminations configured to be surface mounted to a circuit board without leads external to the assembly; and (g) housing the flanges and electrical interconnect such that the packaged SD has a power capacity of greater than about 30 W.

Step (a) may comprise mounting the die to the first flange with a material having a melting point in excess of 240° C. After (d), the method may further comprise thinning the encapsulant to expose backsides of the flanges adjacent the termination surface. Step (d) may occur before (e), and (d) may comprise forming one of a wire bond, and at least one conductive layer and at least one dielectric layer.

Step (g) may comprise mounting a lid to the assembly to house the electrical interconnect in an air cavity, such that the electrical interconnect is free of encapsulation material, and the die has a thickness of about 3 mils to about 5 mils. The flanges may be electrically and thermally conductive and have a thickness of 30 mils to 100 mils, and the packaged SD may be configured to operate at radio frequencies of greater than about 3 kHz.

Embodiments of a method of forming a panel may comprise a plurality of packaged semiconductor devices, including the packaged semiconductor device, and may further comprise cutting the panel to form the plurality of packaged semiconductor devices. Step (g) may occur before or after the panel is cut, and may further comprise placing a metallic film between the packaged semiconductor devices before (d), encapsulating the metallic film in (d), and then cutting the panel at the metallic film such that a metallic portion is formed on side walls of each of the packaged SDs when the panel is cut.

For clarity of illustration, different shading and/or hatching is utilized in the illustrations to distinguish the different elements of the semiconductor device. In addition, a term "horizontal" may be used herein to define a plane parallel to the plane or surface of the semiconductor device, regardless of its orientation. Thus, a term "vertical" refers to a direction perpendicular to the horizontal as defined. Terms, such as "above," "below," "top," "bottom," "side" (as in "sidewall"), "upper," "lower," and so forth are defined with respect to the horizontal plane.

This written description uses examples to disclose the embodiments, including the best mode, and also to enable those of ordinary skill in the art to make and use the invention. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of packaging a semiconductor device (SD), comprising:
    (a) placing a first component comprising a die mounted to a first flange on an adhesive substrate with a first surface of the die on the adhesive substrate and with the first flange extending from a second surface of the die opposite the first surface, wherein the die is mounted to the first flange with a die attach material having a melting point in excess of 240° C.;
(b) placing a second flange on the adhesive substrate adjacent to but spaced apart from the first component, wherein the die and the second flange have surfaces that are co-planar;
(c) electrically interconnecting the die and the second flange;
(d) housing at least portions of the flanges by encapsulation to form an assembly surrounding the flanges;
(e) adding an additional conductive layer of material to surfaces of the flanges opposite the die to form a termination surface with terminations configured to be surface mounted to a circuit board without leads external to the assembly; and
(f) housing the flanges and electrical interconnect such that the packaged SD has a power capacity of greater than about 30 W.

2. A method according to claim 1, wherein after (d) further comprising thinning encapsulant to expose backsides of the flanges adjacent the termination surface.

3. A method according to claim 1, wherein (c) comprises forming a wire bond.

4. A method according to claim 1, wherein (d) and (f) comprise substantially encapsulating the flanges, the die and the electrical interconnect in a solid material but not one surface of the flanges.

5. A method according to claim 1, wherein (f) comprises mounting a lid to the assembly to house the electrical interconnect in an air cavity, such that the electrical interconnect is free of encapsulation material.

6. A method according to claim 1, wherein:
the die has a thickness of about 3 mils to about 5 mils;
the flanges are electrically and thermally conductive and each flange has a thickness of about 30 mils to about 100 mils; and
the packaged SD is configured to operate at radio frequencies of about 3 kHz to about 100 GHz.

7. A method according to claim 1, wherein the additional conductive layer of material comprises Sn or NiPdAu and forms the terminations that are co-planar along the termination surface to less than about 0.001 inches.

8. A method of forming a panel comprising a plurality of packaged semiconductor devices, including the packaged semiconductor device of claim 1 and (f) occurs before the packaged semiconductor device is singulated from the panel.

9. A method according to claim 8, further comprising placing a metallic film between the packaged SDs before (d), encapsulating the metallic film in (f), and then cutting the panel at the metallic film such that a metallic portion is formed on side walls of each of the packaged SDs when the panel is cut, and the metallic film comprises Cu and has a thickness of about 5 mils.

10. A method according to claim 1, wherein the packaged SD has no side wall terminations, the termination surface comprises a first surface area, and the terminations comprise a second surface area that is in a range of about 0.2% to about 20% of the first surface area, and further comprising embedding at least one of the first and second flanges in the circuit board.

11. A method of packaging a semiconductor device (SD), comprising:
(a) mounting a die to a first flange to form a first component;

(b) placing a first surface of the die on the adhesive substrate with the first flange extending from a second surface of the die opposite the first surface;
(c) placing a second flange on the adhesive substrate adjacent to but spaced apart from the first component, and the die and second flange have surfaces that are co-planar;
(d) housing at least portions of the die and flanges by encapsulation to form an assembly;
(e) electrically interconnecting the die and the second flange;
(f) adding an additional conductive layer of material to surfaces of the flanges opposite the die to form a termination surface with terminations configured to be surface mounted to a circuit board without leads external to the assembly; and
(g) housing the flanges and electrical interconnect such that the packaged SD has a power capacity of greater than about 30 W.

12. A method according to claim 11, wherein (a) comprises mounting the die to the first flange with a material having a melting point in excess of 240° C.

13. A method according to claim 11, wherein after (d) further comprising thinning the encapsulant to expose backsides of the flanges adjacent the termination surface.

14. A method according to claim 11, wherein (d) occurs before (e), and (d) comprises forming one of a wire bond, and at least one conductive layer and at least one dielectric layer.

15. A method according to claim 11, wherein (g) comprises mounting a lid to the assembly to house the electrical interconnect in an air cavity, such that the electrical interconnect is free of encapsulation material, and the die has a thickness of about 3 mils to about 5 mils.

16. A method according to claim 11, wherein the flanges are electrically and thermally conductive and have a thickness of 30 mils to 100 mils, and the packaged SD is configured to operate at radio frequencies of greater than about 3 kHz.

17. A method of forming a panel comprising a plurality of packaged semiconductor devices, including the packaged semiconductor device of claim 11, and further comprising cutting the panel to form the plurality of packaged semiconductor devices, and (g) occurs before or after the panel is cut, and further comprising placing a metallic film between the packaged semiconductor devices before (d), encapsulating the metallic film in (d), and then cutting the panel at the metallic film such that a metallic portion is formed on side walls of each of the packaged semiconductor devices when the panel is cut.

18. A packaged semiconductor device (SD), comprising:
a termination surface comprising a plurality of terminations configured as leadless interconnects to be surface mounted to a circuit board;
a first flange having a first surface and a second surface, the first surface providing a first one of the plurality of terminations, and the second surface is opposite to the first surface;
a second flange having a first surface and a second surface, the first surface providing a second one of the plurality of terminations, and the second surface is opposite to the first surface;
a die mounted to the second surface of the first flange with a Pb-free, die attach material having a melting point in excess of 240° C. to form a first component, wherein the die and the second flange have surfaces that are co-planar, a first surface of the die having been placed, at least temporarily, on an adhesive substrate with the first flange extending from a second surface of the die opposite the first surface, the second flange having been placed, at least temporarily, on the adhesive substrate adjacent to but spaced apart from the first component; and an electrical interconnect between the die and the second surface of the second flange opposite the termination surface, such that the electrical interconnect, first flange and second flange are substantially housed within a body such that the packaged SD has a power capacity of greater than about 30 W, wherein at least portions of the die and the flanges are encapsulated to form an assembly, wherein an additional conductive layer of material is added to surfaces of the flanges opposite the die to form a termination surface with terminations configured to be surface mounted to a circuit board without leads external to the assembly.

19. A packaged SD according to claim 18, wherein all of the terminations of the packaged SD are on the termination surface.

\* \* \* \* \*